United States Patent
Weng et al.

(10) Patent No.: US 9,110,824 B2
(45) Date of Patent: Aug. 18, 2015

(54) METHOD, CONTROLLER, AND MEMORY DEVICE FOR CORRECTING DATA BIT(S) OF AT LEAST ONE CELL OF FLASH MEMORY

(71) Applicant: Silicon Motion Inc., Hsinchu County (TW)

(72) Inventors: Chen-Yu Weng, Kaohsiung (TW); Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 83 days.

(21) Appl. No.: 13/912,215

(22) Filed: Jun. 7, 2013

(65) Prior Publication Data

US 2013/0332801 A1 Dec. 12, 2013

Related U.S. Application Data

(60) Provisional application No. 61/657,035, filed on Jun. 8, 2012.

(30) Foreign Application Priority Data

Jun. 5, 2013 (TW) .............................. 102119960 A

(51) Int. Cl.
*G06F 11/10* (2006.01)
*G06F 12/02* (2006.01)
*G11C 16/34* (2006.01)
*G11C 29/04* (2006.01)

(52) U.S. Cl.
CPC ........ *G06F 11/1008* (2013.01); *G06F 11/1048* (2013.01); *G06F 12/0246* (2013.01); *G11C 16/3404* (2013.01); *G11C 16/3418* (2013.01); *G11C 2029/0411* (2013.01)

(58) Field of Classification Search
CPC .................................................... G06F 11/1068
USPC .......................... 714/773, 719, 755, 763, 794
See application file for complete search history.

(56) References Cited

U.S. PATENT DOCUMENTS

| | | | | |
|---|---|---|---|---|
| 7,027,329 B2 * | 4/2006 | Sakuma et al. | .......... | 365/185.01 |
| 7,149,116 B2 * | 12/2006 | Sakuma et al. | .......... | 365/185.14 |
| 7,904,790 B2 * | 3/2011 | Lee et al. | ....................... | 714/763 |
| 8,112,689 B2 * | 2/2012 | Hong et al. | ................... | 714/755 |
| 8,599,622 B2 * | 12/2013 | Kim et al. | ................. | 365/185.29 |
| 2010/0135075 A1 | 6/2010 | Moschiano | | |
| 2011/0149658 A1 | 6/2011 | Aritome | | |
| 2011/0157993 A1 | 6/2011 | Kim | | |
| 2012/0033503 A1 | 2/2012 | Kim | | |
| 2012/0320676 A1 | 12/2012 | Lee et al. | | |

FOREIGN PATENT DOCUMENTS

KR 1020120138170 A 12/2012

* cited by examiner

*Primary Examiner* — Fritz Alphonse
(74) *Attorney, Agent, or Firm* — Winston Hsu; Scott Margo

(57) ABSTRACT

A method for correcting data bit of at least a cell of a flash memory includes: determining a contributing factor of level distribution corresponding to an electric level of a first cell to generate a first determination result; and, correcting/modifying the data bit corresponding to the electric potential of the first cell according to the first determination result.

15 Claims, 7 Drawing Sheets

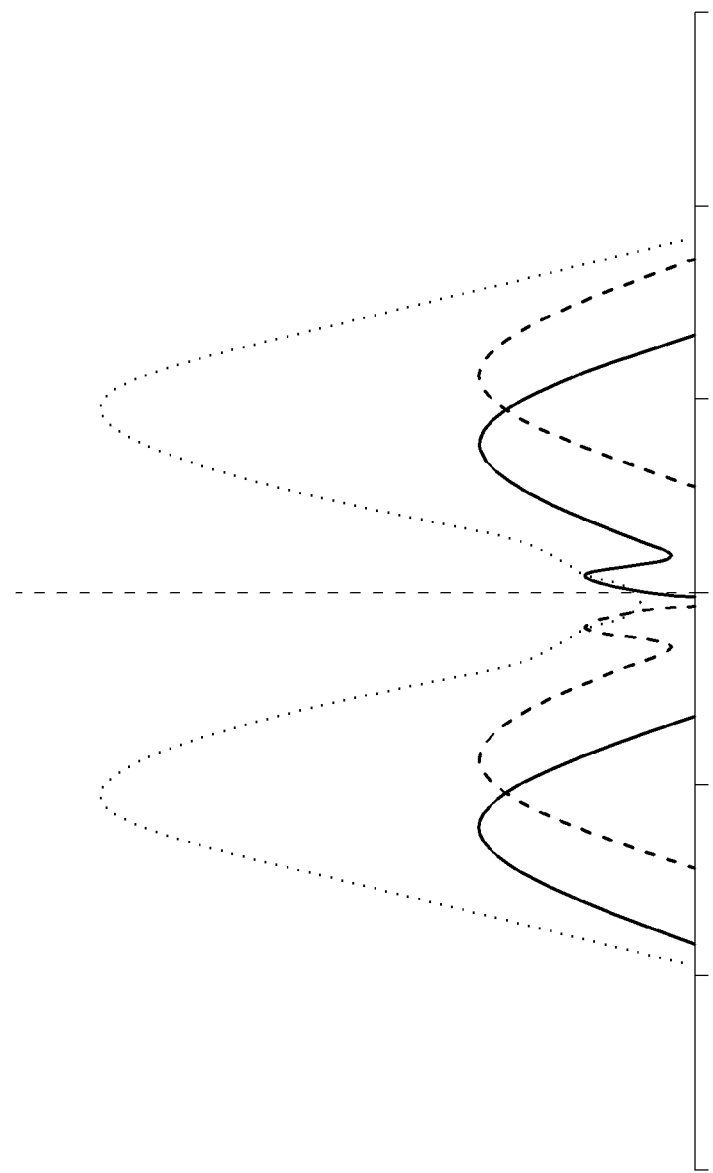

METHOD, CONTROLLER, AND MEMORY DEVICE FOR CORRECTING DATA BIT(S) OF AT LEAST ONE CELL OF FLASH MEMORY

CROSS REFERENCE TO RELATED APPLICATIONS

This application claims the benefit of U.S. Provisional Application No. 61/657,035 filed on Jun. 8, 2012, which is entirely incorporated herein by reference.

BACKGROUND OF THE INVENTION

1. Field of the Invention

The present invention relates to a data correction scheme for a flash memory, and more particularly to a method, controller, and a memory device for correcting data bit(s) of at least one cell of the flash memory.

2. Description of the Prior Art

Generally speaking, an error correction code (ECC) processing circuit may be configured within a conventional flash memory controller. The conventional flash memory controller uses the ECC processing circuit to try to correct data bits read out from a flash memory so as to try to obtain correct data bits. When the total bit errors of codeword data can still corrected by the conventional ECC processing circuit, this indicates that the conventional ECC processing circuit is able to effectively correct bit errors of the codeword data and obtains correct data content. However, if the conventional ECC processing circuit is applied to try to correct the bit errors resulted from electric level shift impact caused by previous data writing or other factors, the conventional ECC processing circuit usually will fail since the number of bit errors caused by the electric level shift impact may become more. Accordingly, the conventional ECC processing circuit may not able to effectively correct data bits readout from the flash memory and thus cannot obtain correct data content.

SUMMARY OF THE INVENTION

Therefore one of objectives of the present invention is to provide a method, a controller, and a memory device for modifying a data bit of a cell of a flash memory to reduce the bit error probability, so as to solve the problem mentioned above.

According an embodiment of the present invention, a method for modifying a data bit of at least a cell of a flash memory is disclosed. The method comprises: determining a contributing factor of level distribution corresponding to an electric level of a first cell to generate a first determination result; and modifying the data bit corresponding to the electric level of the first cell according to the first determination result.

According to the embodiment of the present invention, a controller for modifying a data bit of at least a cell of a flash memory is further disclosed. The controller comprises an accessing unit and an error correction code unit. The accessing unit is utilized for reading a data bit corresponding to an electric level of a first cell. The error correction code unit is coupled to the accessing unit and utilized for determining a contributing factor of level distribution corresponding to the electric level of the first cell to generate a first determination result and for modifying the data bit corresponding to the electric level of the first cell according to the first determination result.

According to the embodiment of the present invention, a memory device is further disclosed. The memory device comprises a flash memory and a memory controller. The flash memory includes a cell with an electric level corresponding to a data bit. The memory controller is coupled to the flash memory and utilized for determining a contributing factor of level distribution corresponding to the electric level of the cell to generate a determination result and for modifying the data bit corresponding to the electric level of the cell according to the determination result.

Further, the above-mentioned embodiment discloses classifying the kind of contributing factor of level distribution corresponding to a storage voltage level for a current cell according to data bits or a storage state of an adjacent cell, and further discloses modifying data bits of the current cell according to the classifications mentioned above. This can achieve the bit flipping and effectively reduce the bit error probability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4B is a diagram illustrating the extended level distributions shown in FIG. 4A after being processed by the bit flipping operation.

DETAILED DESCRIPTION

Figure 1:
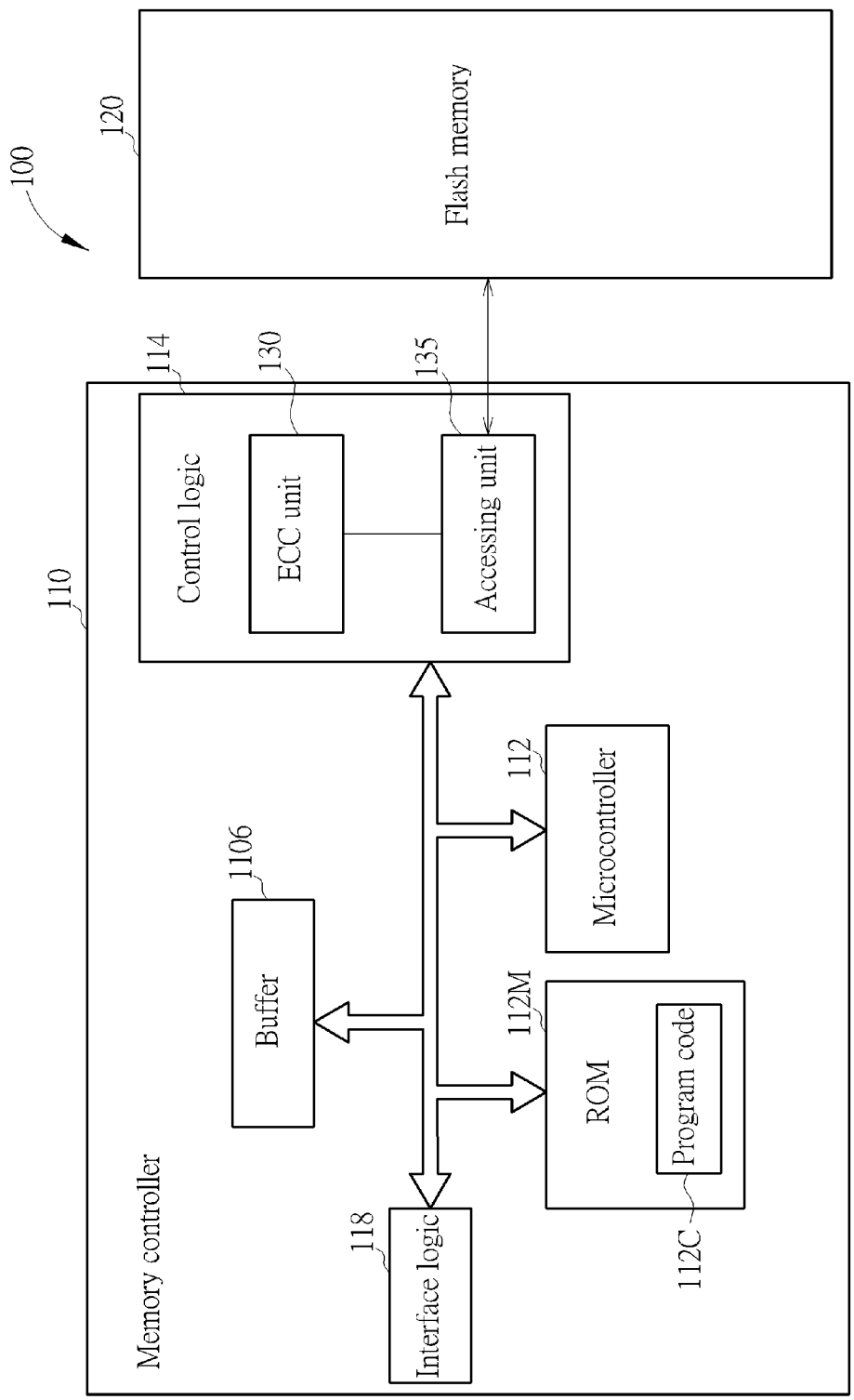
FIG. 1 is a diagram of a memory device according to an embodiment of the present invention.

Please refer to FIG. 1, which is a diagram of a memory device 100 according to an embodiment of the present invention. In this embodiment, the memory device 100 is implemented by a portable memory device such as a memory card that satisfies one of different standards SD/MMC, CF, MS, and XD. The memory device 100 comprises a flash memory 120 and a controller. The controller can be a memory controller 110 and utilized for accessing the flash memory 120. According to this embodiment, the memory controller 110 comprises a microcontroller 112, a read-only-memory (ROM) 112M, a control logic 114, a buffer 116, and an interface logic 118. The ROM 112M is utilized for storing a program code 112C. The microcontroller 112 is arranged to execute the program code 112C for controlling the data access of the flash memory 120. In addition, the control logic 114 comprises an error correction code (ECC) unit 130. The flash memory 120 comprises a plurality of blocks, and the memory controller 110 is arranged to perform operations of data copy, data erase, or data merge on the flash memory 120 by using the microcontroller 112 to execute the program code 112C of the memory controller 110. By using the microcontroller 112 to execute the program code 112C of the memory controller 110, other circuit elements within the memory controller 110 can be used to perform a variety of control operations. For example, the control logic 114 can be used to control data access operation of the flash memory 120, especially for data access of at least one block or at least one data page. The buffer 116 can be also used to buffer data. In addition, the interface logic 118 can be used to communicate with a host device (not shown in FIG. 1).

The memory controller 110 is arranged to receive a command that is transmitted from the above-mentioned host, for accessing the flash memory. Data of the flash memory 120 respectively correspond to multiple word lines each is connected to multiple floating gates of transistors. Each floating gate corresponds to a basic cell. When data is written to one cell, electric charges are exerted on a corresponding floating gate. When data is read out from the cell, a voltage level is obtained according to the electric charges exerted on the corresponding floating gate, and a data bit can be determined based on the obtained voltage level. A cell may be a single-level cell (SLC) or a multiple-level cell (MLC). The SLC includes two storage states and can be used for storing one data bit, and the MLC include more storage states such as four states or eight states and can be used for respectively storing two data bits or three data bits. In this embodiment, the MLC with four storage states is used for illustrative purposes; however, this is not meant to be a limitation of the present invention. The SLC or the other MLC can be also used to implement the cells described in this embodiment of the present invention. The control logic 114 further includes an accessing unit 135 which is arranged to access data bit (digital value) of the current storage state corresponding to the current voltage level of each cell. The ECC unit 130 is arranged to determine whether to estimate the data bits stored in the cells again according to the accessed data bits and is also arranged to determine the error correction code (ECC) operation for the code words.

In this embodiment, data content of each code word is formed by data bits stored by multiple cells within the flash memory 120. The ECC unit 130 is arranged to perform the ECC operation to determine whether error(s) may be introduced into the code word data, and then is arranged to determine whether the error bits can be corrected or not. When the error bits of the cord word data can be corrected effectively, the ECC operation executed by the ECC unit 130 can be immediately applied to correct the error bits, so as to obtain correct code word data content. When the error bits of the cord word data can not be corrected effectively, the ECC unit 130 is not arranged to immediately access the flash memory again. Instead, the ECC unit 130 is arranged to estimate the data bit(s) of a current cell according to the data bit(s) of at least one adjacent cell with respect to the current cell. The ECC unit 130 is arranged to estimate a portion of the data bits read out from the flash memory again, to perform bit flipping upon the portion of data bits that may be erroneous (i.e. the error bits) for correcting the error bits. For example, the ECC unit 130 may exchange or modify the data bits corresponding to one or more storage voltage levels that may be close to the a reference voltage level; the ECC unit 130 may modify the data bit by changing the data bit from bit '0' to bit '1' or from bit '1' to bit '0'. Since bit flipping changes data bits corresponding different storage voltage levels, equivalently the result of the bit flipping can be regarded as a result obtained by finely adjusting the reference voltage levels of the flash memory 120 and re-reading the data of the flash memory 120 according to adjusted reference voltage levels. The reference voltage levels mentioned above are utilized for discriminate which storage state a storage voltage level of a cell belongs to.

That is, the reference voltage levels are sued to determine which data bit the storage voltage level of the cell corresponds to. For example, for a cell with two storage states, a voltage level can be used to determine that a storage voltage level of a cell corresponds to an erase stage (i.e. state '0') or a data state (i.e. state '1'). Thus, by performing bit-flipping upon data bits of a portion of cells, equivalently, this can achieve a result of dynamically adjusting the reference voltage levels applied to the different cells. In other words, by modifying the portion of data bit distribution, this can equivalently achieve a result of modifying a portion of the voltage level distribution. For instance, for a cell with four storage states, three different reference voltage levels are used to determine which storage state a current storage voltage level of the cell corresponds to. The current storage voltage level should correspond to one of states '0'~'3'. By performing bit flipping upon data bits of a portion of cells, this can equivalently obtain a result of finely adjusting the reference voltage level(s) and re-reading the data of the flash memory 120 by using the adjusted reference voltage level(s) even though the bit flipping actually does not modify or adjust the reference voltage level(s). Accordingly, the bit flipping for the portion of data bits can reduce or lower the probability of bit errors.

Specifically, the ECC unit 130 determines a contributing factor of level distribution corresponding to a storage voltage level of a current cell according to the storage state or corresponding data bits of an adjacent cell of the current cell. The contributing factor of level distribution is classified according to the indication of the storage state or corresponding data bits of the adjacent cell. When the storage state of the adjacent cell indicates the erase state '0' or the data state '2', the ECC unit 130 determines the contributing factor of level distribution as a first kind of contributing factor. When the storage state of the adjacent cell indicates the erase state '1' or the data state '3', the ECC unit 130 determines the contributing factor of level distribution as a second kind of contributing factor. The first kind of contributing factor means that the storage level of the adjacent cell causes less potential impact upon the storage voltage level of the current cell, and the second kind of contributing factor means that the storage level of the adjacent cell causes more potential impact upon the storage voltage level of the current cell. That is, the level shift caused by the impact indicated by the second kind of contributing factor is more serious than that indicated by the first kind of contributing factor. In other words, when the ECC unit 130 respectively estimates data bits of two different and distinct cells, different results may be generated. For example, when the ECC unit 130 determines a contributing factor of level distribution corresponding to a storage voltage level of a first cell, the ECC unit 130 is arranged to determine the contributing factor of level distribution according to the storage state or corresponding data bits of an adjacent cell of the first cell (i.e. a first adjacent cell), and the contributing factor of level distribution for the first cell is classified according to the storage state or corresponding data bits of the first adjacent cell. For instance, if the storage state of the first adjacent cell indicates the erase state '0' or the data state '2', then the ECC unit 130 determines the contributing factor of level distribution of the first cell as the first kind of contributing factor. When the ECC unit 130 determines a contributing factor of level distribution corresponding to a storage voltage level of a second cell, the ECC unit 130 is arranged to determine the contributing factor of level distribution according to the storage state or corresponding data bits of an adjacent cell of the second cell (i.e. a second adjacent cell), and the contributing factor of level distribution for the second cell is classified according to the storage state or corresponding data bits of the second adjacent cell. For instance, if the storage state of the second adjacent cell indicates the erase state '1' or the data state '3', then the ECC unit 130 determines the contributing factor of level distribution of the second cell as the second kind of contributing factor. After determining the contributing factor of level distribution for the current cell, the ECC unit 130 is capable of performing appropriate bit flipping upon the data bits of the current cell according to the classified contributing factor of level distribution. This will be detailed in the following paragraphs.

Figure 2:
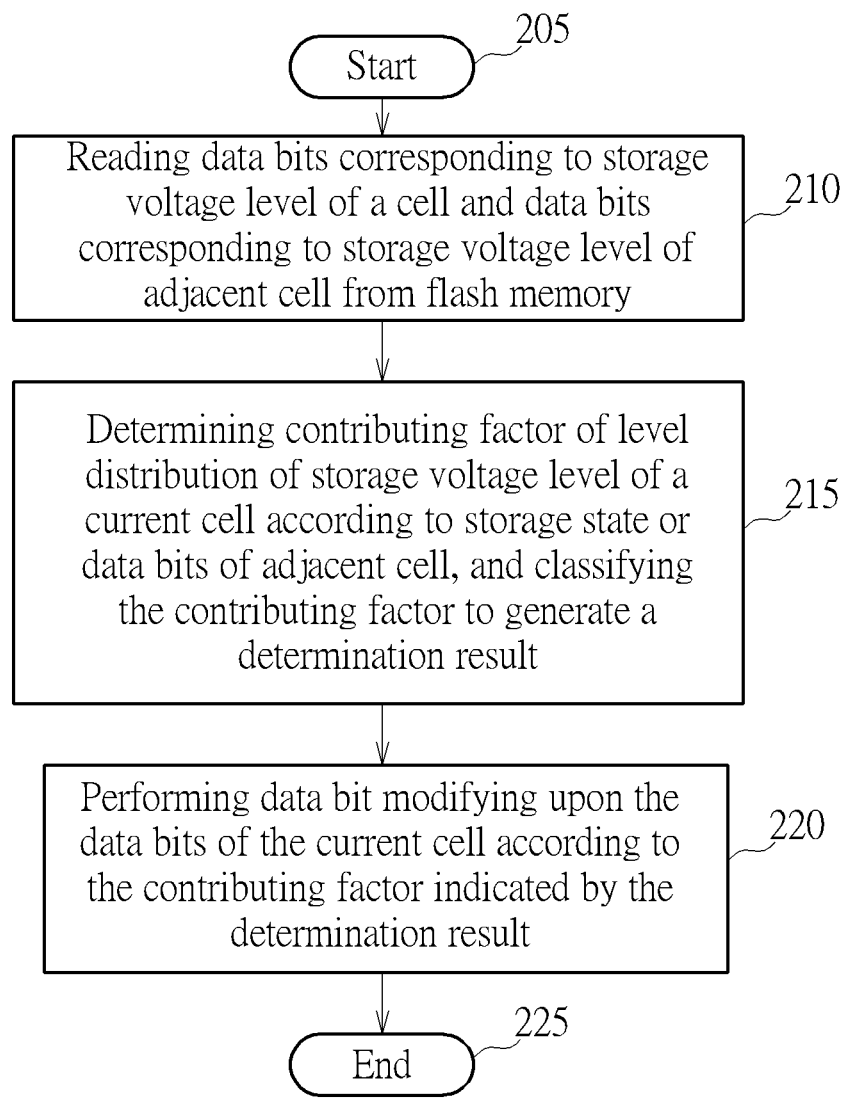
FIG. 2 is a diagram illustrating a flowchart of the operations of the control logic shown in FIG. 1.

To more clearly describe the operations disclosed in the embodiment of the present invention, please refer to FIG. 2, which is a diagram illustrating the operations of the control logic 114 shown in FIG. 1. Provided that substantially the same result is achieved, the steps of the flowchart shown in FIG. 2 need not be in the exact order shown and need not be contiguous, that is, other steps can be intermediate.

Step 205: Start;

Step 210: The accessing unit 135 read data bits corresponding to the storage voltage level of a cell and data bits corresponding to the storage voltage level of at least one adjacent cell from the flash memory 120;

Step 215: The ECC unit 130 determines a contributing factor of level distribution of a storage voltage level of a current cell according to the storage state or data bits of the at least one adjacent cell, and classifies the contributing factor to generate a determination result which shows that the contributing factor indicates the first kind of contributing factor or the second kind of contributing factor;

Step 220: The ECC unit 130 decides to perform data bit modifying upon the data bits of the current cell according to the contributing factor indicated by the determination result, to modify a data bit distribution, so as to achieve bit flipping and reduce the bit error probability; and Step 225: End.

As mentioned above, in Step 215, the ECC unit 130 determines a contributing factor of level distribution of a storage voltage level of a current cell according to the storage state or data bits of the at least one adjacent cell. In this embodiment, the ECC unit 130 determines the contributing factor of the level distribution of the current cell according to the data bits of one adjacent cell. The choice of the adjacent cell can be an adjacent cell which lies vertically below the current cell. The adjacent cell can be also one of the other adjacent cells. In addition, the ECC unit 130 can also determine the contributing factor of the current cell according to the storage states or data bits of multiple adjacent cells. The above-mentioned implementations are modifications of the embodiment of the present invention and all fall within the scope of the present invention.

In the following paragraphs, the operations of this embodiment of the present invention are briefly described again to let the reader to more understand the spirit of the present invention. For a cell of a conventional flash memory, the storage voltage level of the cell is an analog signal, and thus for different cells including the same data bits corresponding to similar storage voltage levels, the storage voltage levels actually may be shifted to different levels. Even though the shifted storage voltage level may be different from the original storage voltage level before shifted, the shifted storage voltage level can be still correctly estimated as a storage state the same as that corresponding to the original storage voltage level only if the shifted storage voltage level is still between two adjacent reference voltage levels which also correctly estimates the original storage voltage level. However, once the shifted storage voltage level is higher or lower than a range of the two adjacent reference voltage levels, the shifted storage voltage level originally corresponding to a certain storage state or data bits may be erroneously estimated to correspond to a different storage state or different data bits. This causes bit errors. Ideally, storage voltage levels corresponding to the same storage state or the same data bits can different but are only allowed between two adjacent reference voltage levels. For a flash memory including multiple storage units, if each storage unit includes four storage states, then there are four different level distributions respectively corresponding four kinds of storage states or data bits for one cell.

Figure 3A:
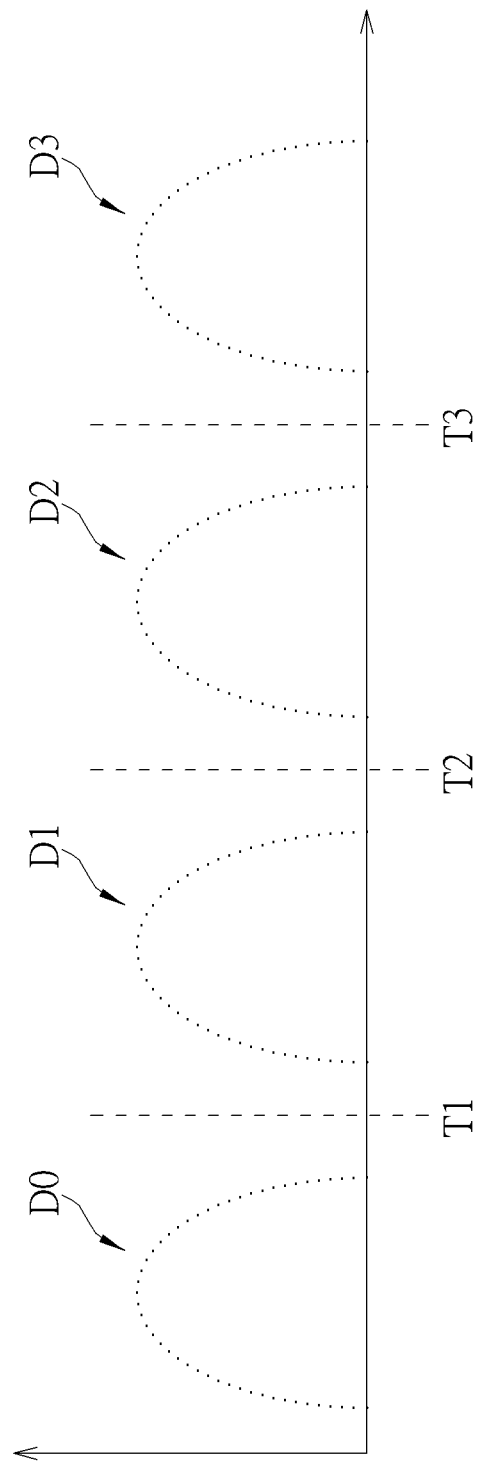
FIG. 3A is a diagram showing an example of an ideal level distribution of a cell having four storage states.
Figure 3B:
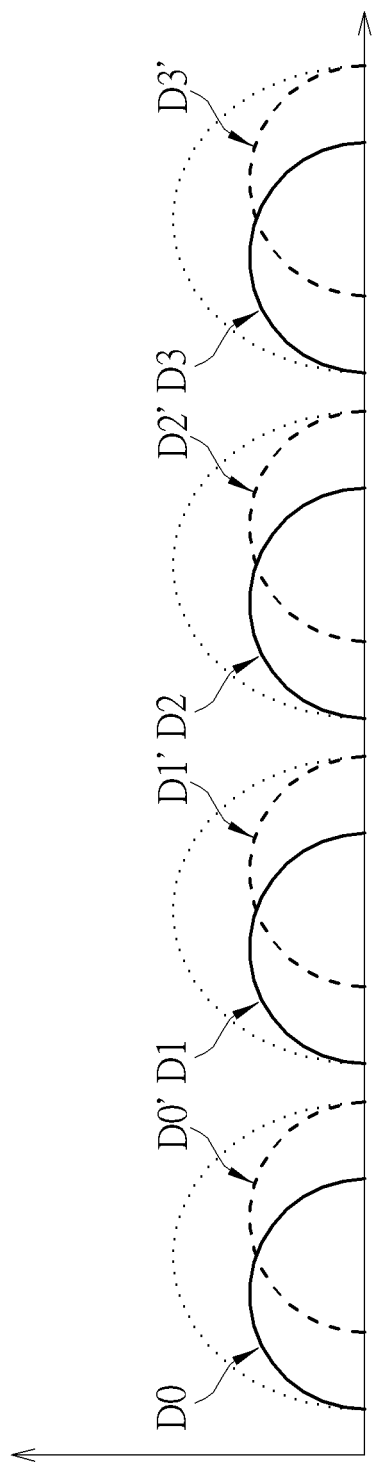
FIG. 3B is a diagram showing an example of level distributions compared to FIG. 3A.
Figure 3C:
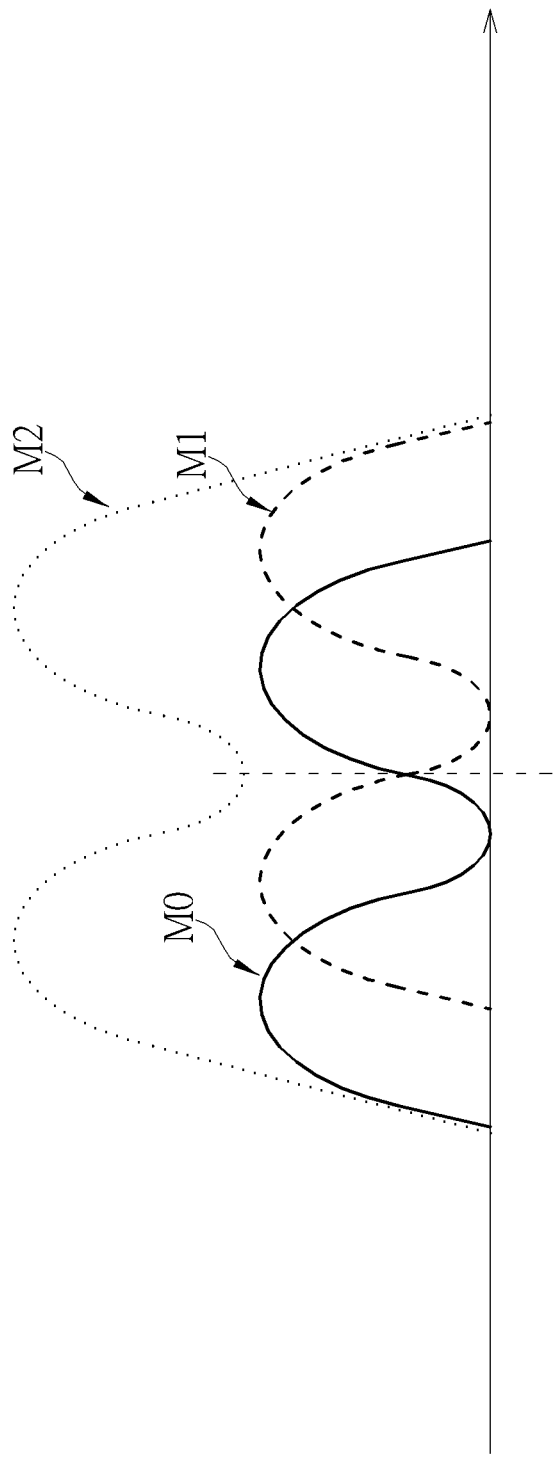
FIG. 3C is a diagram illustrating an overlap caused by two actual level distributions.

Please refer to FIG. 3A, which is a diagram showing an example of an ideal level distribution of a cell having four storage states. As shown in FIG. 3A, the horizontal axis shows the different values of a storage voltage level, and the vertical axis shows the number of the cells in a flash memory. D0-D3 respectively represent different storage states '0'-storage states '3' that indicate different data bits. The level distribution illustrated in FIG. 3A shows that a voltage level corresponding to the center of each distribution corresponds to more cells, and a voltage level corresponding to a point farther from the center of each distribution corresponds to fewer cells. This indicates that ideally there is a higher probability that the storage voltage level of a cell is close to the center of a level distribution; however, FIG. 3A is merely used for illustrative purposes and is not meant to be a limitation of the present invention. In addition, D0-D3 respectively represent ideal level distributions, and each level distribution does not overlap with the other level distributions. Accordingly, the four level distributions can be discriminated between different storage states by using three different reference voltage levels T1-T3. Actually, when data of another cell is written or read, the storage voltage level of the current cell is affected by the storage voltage level of this another cell and may be varied and shifted. The voltage level of the current cell may be raised inappropriately. Thus, actually, the four level distributions for a cell may be shifted. In addition, when different data bits of that another cell are written or read, the storage voltage level of this current cell may be affected in different degrees. Accordingly, for all cells of a flash memory, electric traction in different degrees causes the level distributions extend in addition to cause the level distributions shifted. Please refer to FIG. 3B, which is a diagram showing an example of level distributions compared to FIG. 3A. The distributions D0'-D3' illustrated by dashed lines respectively represent four shifted level distributions, and four ideal level distributions D0-D3 and the shifted distributions D0'-D3' respectively form four extended level distributions that are illustrated by dotted lines shown in FIG. 3B. Please refer to FIG. 3C, which is a diagram illustrating an overlap caused by two actual level distributions. As shown in FIG. 3C, M0 represents two ideal level distributions, and M1 represents two shifted level distributions. M2 represents two extended level distribution. As shown in this figure, each of the tails of two extended level distributions overlaps to the other in the center portion of M2. Once the storage voltage level of a cell is at the center portion of M2, there is a probability that the storage voltage level cannot be correctly estimated to a correct storage stage or correct data bits. This is because the storage voltage level in this situation may belong to one level distribution corresponding to a storage state or may belong to the other level distribution corresponding to a different storage state. Thus, there is a probability that the storage state or data bits of one cell cannot be correctly estimated. This causes a higher bit error probability.

To reduce the bit error probability, in this embodiment, for an example of one cell including four storage states (i.e. two data bits), when data writing or accessing, the memory controller 110 at first is arranged to write the least significant bits (LSB) of the same word line into the flash memory 120, and then is arranged to write the most significant bits (MSB) of the same word line into the flash memory 120, so that the voltage levels of the cells may be raised by two steps when data is written to the cells. For example, for data bits of the state '3', when the data bits are written to a cell, the voltage level at a corresponding floating gate of the cell in the flash memory 120 is raised up to a level range corresponding to the state '2' at the first step, and then is raised up to a level range corresponding to the state '3' at the second step. The two-steps level boosting without directly raising up the voltage level to the level range corresponding to the state '3' can avoid a significant level shift. In addition, as described above, for the memory controller 110, the ECC unit 130 is further arranged to classify the contributing factor of the level distribution for the storage voltage level of the current cell by referring to data bits of at least one adjacent cell. The ECC unit 130 classifies the contributing factors into the first kind of contributing factors and the second kind of contributing factors at least. The find of contributing factors means that the storage level of the adjacent cell causes less potential impact upon the storage voltage level of the current cell, and the second of contributing factors means that the storage level of the adjacent cell causes more potential impact upon the storage voltage level of the current cell. After the classification of the contributing factors, the ECC unit 130 is arranged to correct different bits upon the data bits of the current cell based on the classification, to achieve the bit flipping and reduce the bit error probability.

Figure 4A:
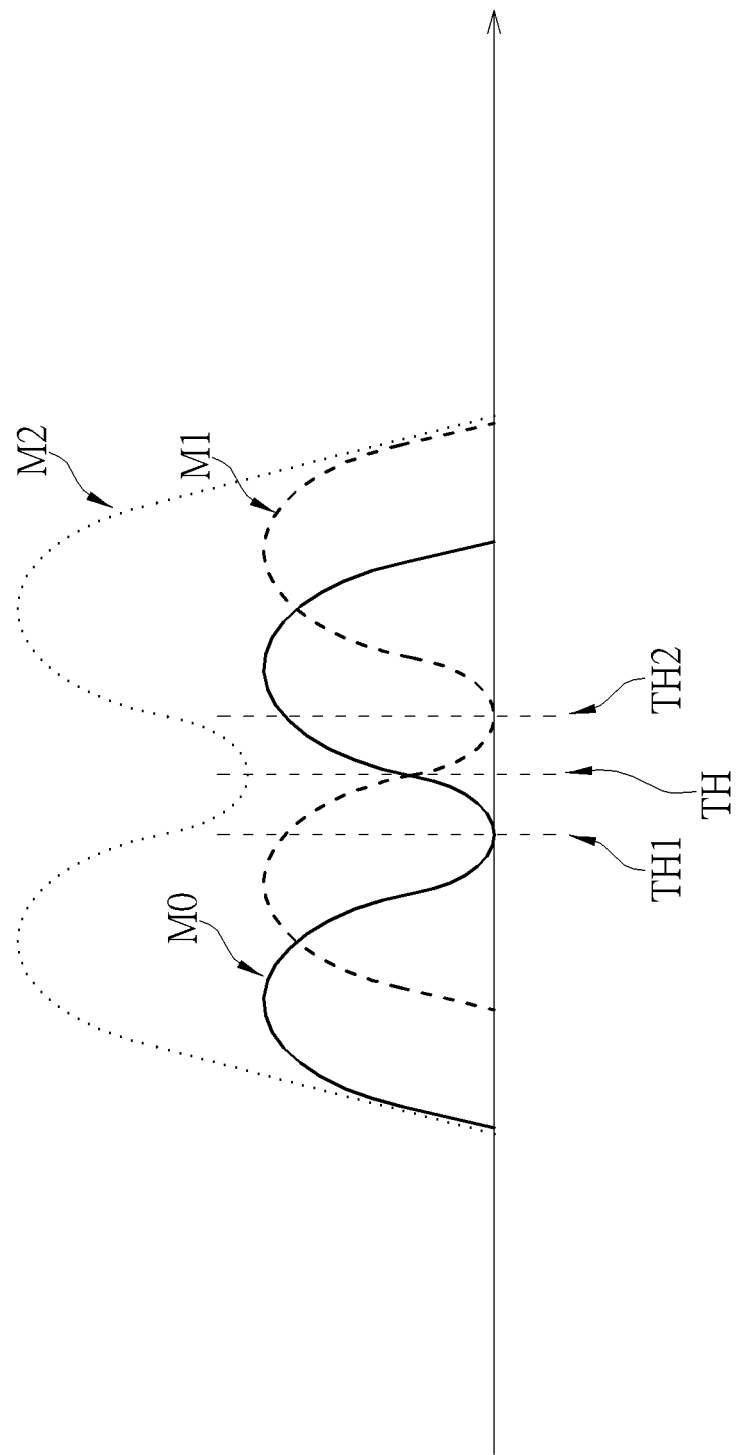
FIG. 4A is a diagram of an example of different bit corrections for achieving equivalently adopting different assumed reference voltage levels TH1 and TH2 to estimate data bits of different cells corresponding to different contributing factors of levels distributions.

Please refer to FIG. 4A, which is a diagram of an example of different bit corrections for achieving equivalently adopting different reference voltage levels TH1 and TH2 to estimate data bits of different cells corresponding to different contributing factors of levels distributions. As shown in FIG. 4A, it is assumed that TH shown in FIG. 4A represents an original reference voltage level that is used for discriminating between two different storage states. That is, when two actual level distributions respectively extend and overlap with each other at the tails, in this situation, a conventional scheme may merely adopt the original reference voltage level TH and the ECC operation of a conventional controller to try to obtain correct data bits. However, the number of error bits that can be corrected by the ECC operation is limited. When most of the storage voltage levels corresponding to data bits of a codeword is close to the reference voltage level TH, there is a great probability that these data bits after estimated may be incorrect. This causes a higher bit error probability.

In order to solve this problem, the ECC unit 130 of the memory controller 110 is arranged to determine the contributing factor of the level distribution for the current cell after detecting that only the ECC operation can not be used to obtain correct data bits. For an example of the contributing factor determination, when the ECC unit 130 determines that the storage voltage level of the current cell may be affected by the storage states '0' or '2' of an adjacent cell, the ECC unit 130 classifies the current cell as a first kind of cells corresponding to the first kind of contributing factor mentioned above. That is, the current cell is classified into a first kind of cell that is not affected by adjacent cell(s) materially. Instead, when the ECC unit 130 determines that the storage voltage level of the current cell may be affected by the storage states '1' or '3' of an adjacent cell, the ECC unit 130 classifies the current cell as the second kind of cells corresponding to the second kind of contributing factor mentioned above. That is, the current cell is classified into a second kind of cell that may be affected by adjacent cell(s) materially. Then, the ECC unit 130 performs different bit corrections based on the above-mentioned classifications to achieve the bit flipping. This operation can equivalently achieve the result of using different reference voltage levels to respectively discriminate between different storage states for different cells.

As shown in FIG. 4A, since the ECC unit 130 can correctly classify the extended level distributions to two different groups, the extended level distributions can be discriminated from the portion indicated by the solid curve to the portion indicated by the dashed curve. The portion indicated by the solid curve indicates a distribution of the first kind of cells after classification, and the portion indicated by the dashed curve indicates a distribution of the second kind of cells after classification. When a cell is classified into a group of the first kind of cells, the ECC unit 130 determines that the storage voltage level of this cell may be affected by less improper voltage level boosting or almost may be not raised up by an improper voltage. The actual level distribution of the first kind of cell is shown by the solid curve. If the assumed voltage level TH1 is used as a reference level for discriminating between different storage states or different data bits, the storage state or data bits of the cell can be correctly estimated. However, if the original voltage level TH is used as the reference level for discriminating between different storage states or different data bits, then the portions of data bits corresponding to the voltage levels fall within the range of TH1-TH will be estimated incorrectly. Thus, when the ECC unit 130 determines that the data bits of the current cell cannot be estimated correctly and the current cell is classified into the first kind of cell, this indicates that the storage voltage level of the current cell may fall within the range of TH1-TH and the data bits are incorrectly estimated. In this situation, the ECC unit 130 is arranged to perform data bit correction for the bits of the current cell to obtain correct data bits and to effectively reduce the bit error probability. For the data bit correction, suppose that the left portion of the voltage level TH in FIG. 4A correspond to data bit '01' and the right portion correspond to the data bit '10'. When the ECC unit 130 detects that current data bits cannot be correctly decoded and then classifies the current cell as the first kind of cell, this situation indicates that the storage voltage level of the current cell may fall within a range formed by the levels TH1-TH, i.e. the portion indicated by the solid curve, and the current data bits may be erroneously estimated as '01'. In this situation, the ECC unit 130 is arranged to modify the current data bits by changing the erroneous data bits from '01' to correct data bits '10', so as to reduce bit errors and achieve effective bit correction. The above-mentioned example about bits '01' and '10' is merely used for illustrative purposes, and not meant to be a limitation of the present invention. In this example, the storage states or data bits corresponding to the storage voltage levels falling within the range of TH1-TH are modified as different storage states or different data bits. Even though this disclosed embodiment does not adjust the actual reference voltage levels to re-read data from a flash memory and estimate the data from the flash memory again, however, this embodiment equivalently can obtain the same result of finely and gradually adjusting the reference voltage level from TH to the assumed level TH1 and then using the assumed level TH1 to re-read data from a flash memory and estimate the data from the flash memory again.

Additionally, when the ECC unit 130 detects that the data bits of the current cell cannot be estimated correctly and the current cell is classified as the second kind of cell, this indicates that the storage voltage level of the current cell may fall within the range of TH-TH2 and the data bits after estimated are erroneous. In this situation, the ECC unit 130 is arranged to perform data bit correction for the bits of the current cell to obtain correct data bits and to effectively reduce the bit error probability. For the data bit correction, suppose that the left portion of the voltage level TH in FIG. 4A correspond to data bits '01' and the right portion correspond to data bits '10'. When the ECC unit 130 detects that current data bits cannot be correctly decoded and then classifies the current cell as the second kind of cell, this situation indicates that the storage voltage level of the current cell may fall within the range formed by the levels TH-TH2, i.e. the portion indicated by the dashed curve, and the current data bits may be erroneously estimated as '10'. In this situation, the ECC unit 130 is arranged to modify the current data bits by changing the erroneous data bits from '10' to correct data bits '01', so as to reduce bit errors and achieve effective bit correction. The above-mentioned example about bits '01' and '10' is merely used for illustrative purposes, and not meant to be a limitation of the present invention. In this example, the storage states or data bits corresponding to the storage voltage levels falling within the range of TH-TH2 are modified as different storage states or different data bits. Even though this disclosed embodiment does not adjust the actual reference voltage levels to re-read data from a flash memory and estimate the data from the flash memory again, however, this embodiment equivalently can obtain the same result of finely and gradually adjusting the reference voltage level from TH to the assumed level TH2 and then using the assumed level TH2 to re-read data from a flash memory and estimate the data from the flash memory again. In addition, it should be noted that in the above-mentioned examples the bit flipping operation described in the disclosed embodiment of the present invention is formed by an operation of modifying a set of erroneous data bits and an operation of modifying another corresponding set of erroneous data bits. For example, the bit flipping operation may be formed by correcting erroneous bits from '01' to correct data bits '10' and correcting erroneous bits from '10' to correct data bits '01'; this is not meant to be a limitation of the present invention.

For the bit flipping operation, the disclosed embodiment provides determining a contributing factor of level distribution corresponding to an electric level of a first cell to generate a first determination result and modifying the data bit corresponding to the electric level of the first cell according to the first determination result. In addition, the disclosed embodiment provides determining a contributing factor of level distribution corresponding to an electric level of a second cell to generate a second determination result and modifying the data bit corresponding to the electric level of the second cell according to the second determination result. An original data bit of the first cell is equal to a modified data bit of the second cell, and a modified data bit of the first cell is equal to an original data bit of the second cell. The bit flipping operation is formed by respective operations for modifying the data bits of the first and second cells.

Please refer to FIG. 4B, which is a diagram illustrating the extended level distributions shown in FIG. 4A after being processed by the bit flipping operation. As shown in FIG. 4B, after the processing of the bit flipping operation, the erroneous storage states or data bits after estimated corresponding to the storage voltage levels falling within the range of TH1-TH can be equivalently amended as another set of correct data bits. As shown in FIG. 4B, a part of the solid curve in FIG. 4A, which is originally illustrated on the left side of the level TH, is equivalently illustrated again on the right side of the level TH after the bit flipping operation. In addition, the erroneous storage states or data bits after estimated corresponding to the storage voltage levels falling within the range of TH-TH2 can also be equivalently amended as another set of correct data bits. As shown in FIG. 4B, a part of the dashed curve in FIG. 4A, which is originally illustrated on the right side of the level TH, is equivalently illustrated again on the left side of the level TH after the bit flipping operation. By doing so, after being processed by the bit flipping operation, the number of erroneous data bits corresponding to the center and its neighborhood of the whole original level distribution can be greatly reduced. Equivalently, for codeword data, the number of erroneous bits corresponding to the storage voltage level located at the center of the whole level distribution after processed by the bit flipping operation becomes fewer or almost zero substantially. In other words, this can greatly reduce the bit error probability for codeword data. In another embodiment, when the bit errors of codeword data cannot be effectively corrected by merely using the ECC operation (i.e. too many bit errors), the ECC unit 130 is arranged to perform the bit flipping operation to reduce or decrease the number of bit errors in the codeword data. Once the number of bit errors in the codeword data has been decreased, the ECC unit 130 can directly correct the bit errors by using the ECC operation to obtain the correct data bits of the codeword data. Therefore, by the above bit flipping operation, the probability of bit errors being not effectively corrected can be decreased.

Further, the current cell and the adjacent cell(s) can be located at the same word line of the flash memory 120 or at different word lines. If the current cell and the adjacent cell(s) are at the same word line, then the choice of the adjacent cell(s) may be the left-side or right-side cells. If the current cell and the adjacent cell(s) are at the different word lines, then the choice of the adjacent cell(s) may be cell(s) below or above the current cell. That is, the adjacent cell(s) may be located at a previous word line or at a next word line. If the adjacent cell(s) is/are at the previous word line, then the memory controller 110 can buffer data of the previous word line as a reference for determining the contributing factor of the level distribution after the data of the previous word line has been read out by the accessing unit 135 from the flash memory 120. In addition, if the adjacent cell(s) is/are at the next word line, then the memory controller 110 can buffer data of the next word line as a reference for determining the contributing factor of the level distribution after controlling the accessing unit 135 to read out the data of the next word line from the flash memory 120.

Further, in the embodiments, the implementation of the cells with four storage states is merely used for illustrative purposes, and should not meant to be a limitation of the present invention. In other embodiments, cells with two, eight, or more storage units all can be used for the implementation of the present invention. In other words, any kinds of cells are all applied for the present invention. Further, the embodiments of the present invention disclose classifying a contributing factor of level distribution for the storage voltage level of a cell into the first kind of contributing factor or the second kind of contributing factor according to electric traction in different degrees. That is, equivalently, the embodiments disclose classifying the cell into the first kind of cell or the second kind of cell according to the electric traction in different degrees. In addition, the embodiments disclose modifying erroneous data bits (i.e. the bit flipping operation) according to the classifications mentioned above, so as to equivalently achieve the same result obtained by adjusting different reference voltage levels to re-estimate the data bits from a flash memory. Thus, two-steps data accessing/writing (i.e. two-steps voltage boosting) disclosed in a preferred embodiment mentioned above is merely used for illustrative purposes and should not meant to be a limitation of the present invention. One-step data accessing/writing (i.e. one-step voltage boosting) can be applied to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for modifying a data bit of at least a cell of a flash memory, comprising:
   (a) determining a contributing factor of level distribution corresponding to an electric level of a first cell to generate a first determination result, the contributing factor of level distribution comprising potential impact caused by a storage level of another cell to the electric level of the first level; and
   (b) modifying the data bit corresponding to the electric level of the first cell according to the first determination result.

2. The method of claim 1, wherein the step of generating the first determination result comprises:
   determining the contributing factor of level distribution corresponding to the electric level of the first cell according to a data bit of a first adjacent cell.

3. The method of claim 2, wherein the first cell is with four storage states, and the step of determining the contributing factor of level distribution corresponding to the electric level of the first cell comprises:
   determining that the contributing factor is a first kind of contributing factor when the data bit of the first adjacent cell indicates an erase state '0' or a data state '2'; and
   determining that the contributing factor is a second kind of contributing factor when the data bit of the first adjacent cell indicates a data state '1' or a data state '3';
   wherein the second kind of contributing factor indicates more level shift impact than that indicated by the first kind of contributing factor.

4. The method of claim 2, wherein the first cell and the first adjacent cell are located at different word lines, and the first adjacent cell is located below the first cell.

5. The method of claim 2, wherein the first cell and the first adjacent cell are located at different word lines, and the first adjacent cell is located above the first cell.

6. The method of claim 1, further comprising:
   determining a contributing factor of level distribution corresponding to an electric level of a second cell to generate a second determination result; and
   modifying the data bit corresponding to the electric level of the second cell according to the second determination result;
   wherein an original data bit of the first cell is equal to a modified data bit of the second cell, a modified data bit of the first cell is equal to an original data bit of the second cell, and a bit flipping operation is formed by respective operations for modifying the data bits of the first and second cells.

7. The method of claim 1, further comprising:
   performing an error correction code operation to determine whether error bit(s) of codeword data can be corrected or not; and
   performing step (a) to step (b) of claim 1 when the error bit(s) of codeword data cannot be effectively corrected.

8. A controller for modifying a data bit of at least a cell of a flash memory, comprising:
   an accessing unit, for reading a data bit corresponding to an electric level of a first cell; and
   an error correction code unit, coupled to the accessing unit, for determining a contributing factor of level distribution corresponding to the electric level of the first cell to generate a first determination result, and modifying the data bit corresponding to the electric level of the first cell according to the first determination result;
   wherein the contributing factor of level distribution comprises potential impact caused by a storage level of another cell to the electric level of the first level.

9. The controller of claim 8, wherein the error correction code unit determines the contributing factor of level distribution corresponding to the electric level of the first cell according to a data bit of a first adjacent cell.

10. The controller of claim 9, wherein the first cell is with four storage states;
    the error correction code unit determines that the contributing factor is a first kind of contributing factor when the data bit of the first adjacent cell indicates an erase state '0' or a data state '2'; the error correction code unit determines that the contributing factor is a second kind of contributing factor when the data bit of the first adjacent cell indicates a data state '1' or a data state '3'; and, the second kind of contributing factor indicates more level shift impact than that indicated by the first kind of contributing factor.

11. The controller of claim 9, wherein the first cell and the first adjacent cell are located at different word lines, and the first adjacent cell is located below the first cell.

12. The controller of claim 9, wherein the first cell and the first adjacent cell are located at different word lines, and the first adjacent cell is located above the first cell.

13. The controller of claim 8, wherein the error correction code unit determines a contributing factor of level distribution corresponding to an electric level of a second cell to generate a second determination result, and modifies the data bit corresponding to the electric level of the second cell according to the second determination result; an original data bit of the first cell is equal to a modified data bit of the second cell, a modified data bit of the first cell is equal to an original data bit of the second cell, and a bit flipping operation is formed by respective operations for modifying the data bits of the first and second cells.

14. The controller of claim 8, wherein the error correction code unit performs an error correction code operation to determine whether error bit(s) of codeword data can be corrected or not; and, when the error bit(s) of codeword data cannot be effectively corrected, the error correction code unit determines a contributing factor of level distribution corresponding to the electric level of the first cell to generate a first determination result, and modifies the data bit corresponding to the electric level of the first cell according to the first determination result.

15. A memory device, comprising:
    a flash memory having a cell with an electric level corresponding to a data bit; and
    a memory controller, coupled to the flash memory, for determining a contributing factor of level distribution corresponding to the electric level of the cell to generate a determination result, and modifying the data bit corresponding to the electric level of the cell according to the determination result;
    wherein the contributing factor of level distribution comprises potential impact caused by a storage level of another cell to the electric level of the level.

* * * * *